US009761721B2

(12) United States Patent
Leobandung et al.

(10) Patent No.: US 9,761,721 B2
(45) Date of Patent: Sep. 12, 2017

(54) FIELD EFFECT TRANSISTORS WITH SELF-ALIGNED EXTENSION PORTIONS OF EPITAXIAL ACTIVE REGIONS

(71) Applicant: International Business Machines Corporation, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 14/282,069

(22) Filed: May 20, 2014

(65) Prior Publication Data

US 2015/0340488 A1    Nov. 26, 2015

(51) Int. Cl.
*H01L 29/78* (2006.01)
*H01L 29/66* (2006.01)
*H01L 29/06* (2006.01)

(52) U.S. Cl.
CPC ........ *H01L 29/785* (2013.01); *H01L 29/0673* (2013.01); *H01L 29/66795* (2013.01)

(58) Field of Classification Search
CPC .................. H01L 29/66818; H01L 29/66636
See application file for complete search history.

(56) References Cited

U.S. PATENT DOCUMENTS

| 7,101,763 B1 | 9/2006 | Anderson et al. |
| 7,119,369 B2 | 10/2006 | Wang et al. |
| 7,525,160 B2* | 4/2009 | Kavalieros ........ H01L 29/66628 257/369 |
| 8,124,473 B2 | 2/2012 | Pan et al. |
| 8,313,999 B2* | 11/2012 | Cappellani ........ H01L 21/26506 257/E21.421 |
| 8,420,464 B2 | 4/2013 | Basker et al. |
| 8,507,892 B2 | 8/2013 | Bangsaruntip et al. |
| 2010/0176438 A1 | 7/2010 | Lue et al. |
| 2011/0147842 A1* | 6/2011 | Cappellani ........ H01L 21/26506 257/365 |
| 2011/0180871 A1 | 7/2011 | Anderson et al. |
| 2015/0140757 A1* | 5/2015 | Kim .................. H01L 29/66795 438/283 |

* cited by examiner

*Primary Examiner* — Samuel Gebremariam
*Assistant Examiner* — Jonas T Beardsley
(74) *Attorney, Agent, or Firm* — Scully, Scott, Murphy & Presser, P.C.; Louis J. Percello, Esq.

(57) ABSTRACT

A gate structure is formed across a single crystalline semiconductor fin. An amorphizing ion implantation is performed employing the gate structure as an implantation mask to amorphize surface portions of the semiconductor fin into inverted U-shaped amorphous semiconductor portions. A gate spacer is formed around the gate structure, and the inverted U-shaped amorphous semiconductor portions are etched selective to a single crystalline portion of the semiconductor fin and the gate structure. A pair of inverted U-shaped cavities is formed underneath the gate spacer and above the remaining portion of the semiconductor fin. A doped epitaxial semiconductor material is deposited by a selective epitaxy process to form doped epitaxial active regions that include self-aligned extension portions underlying the gate spacer.

11 Claims, 7 Drawing Sheets

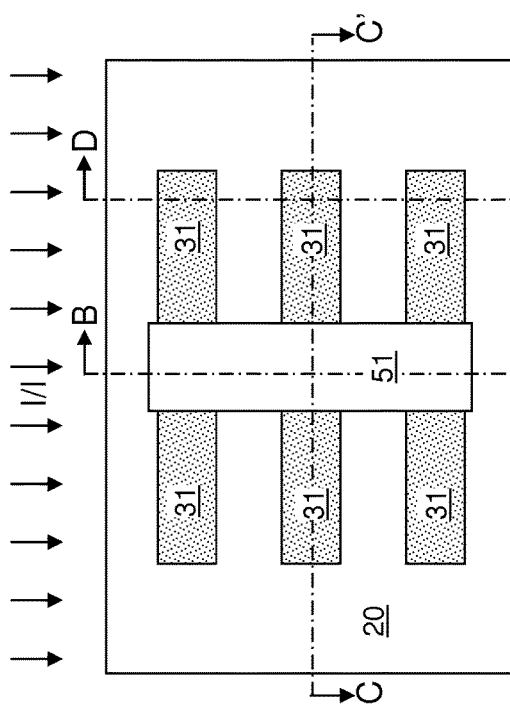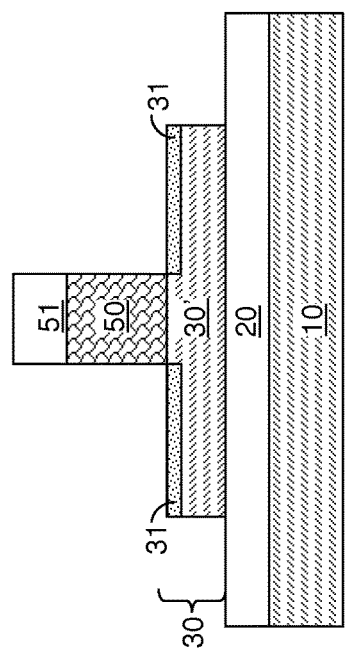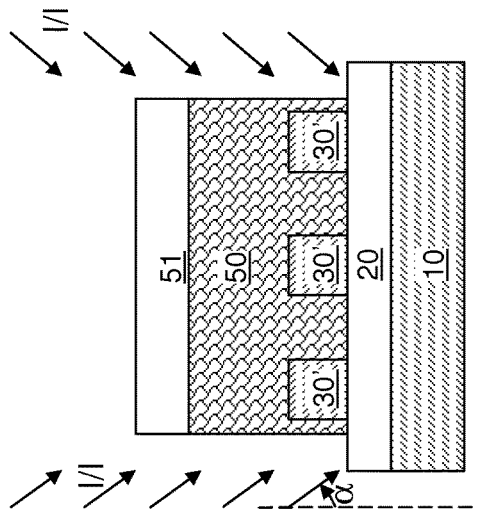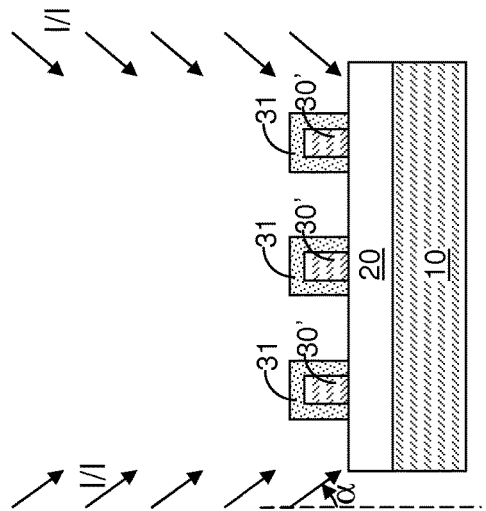

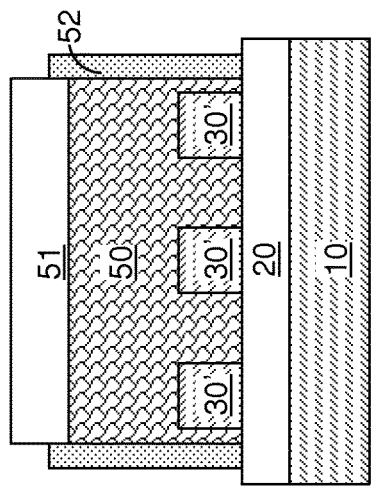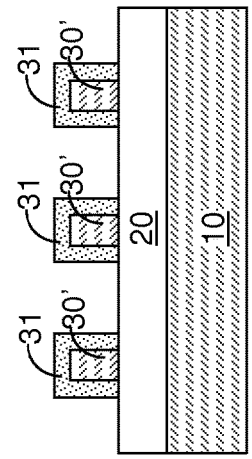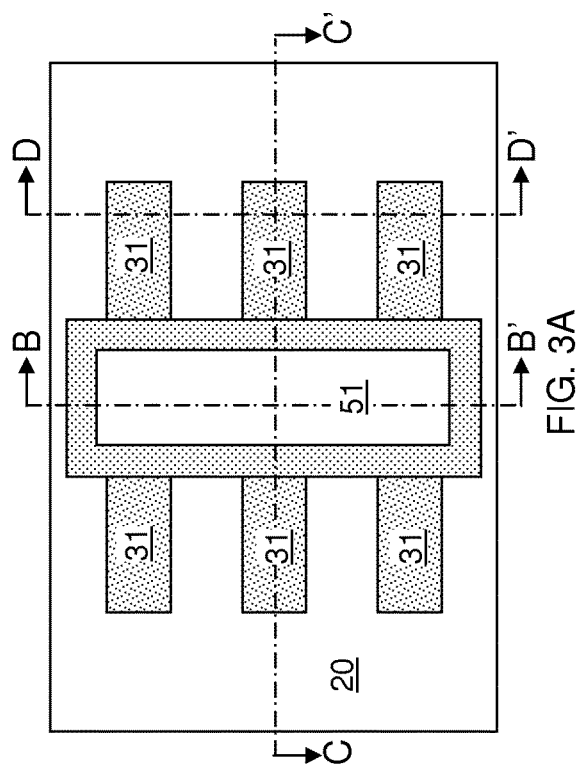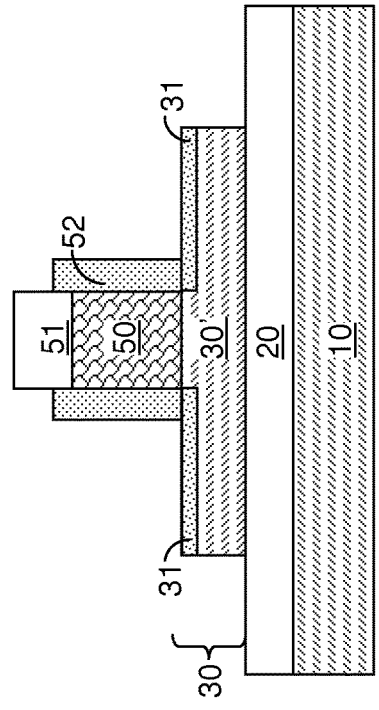
FIG. 3A
FIG. 3B
FIG. 3C
FIG. 3D

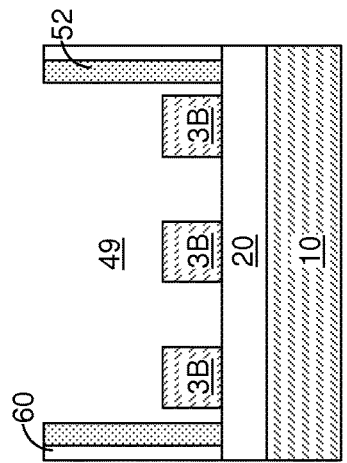
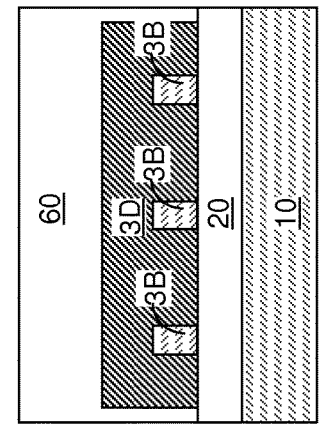
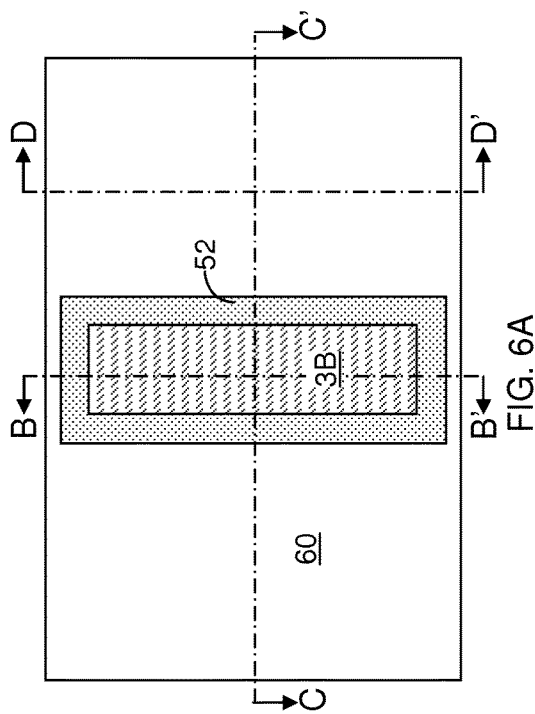
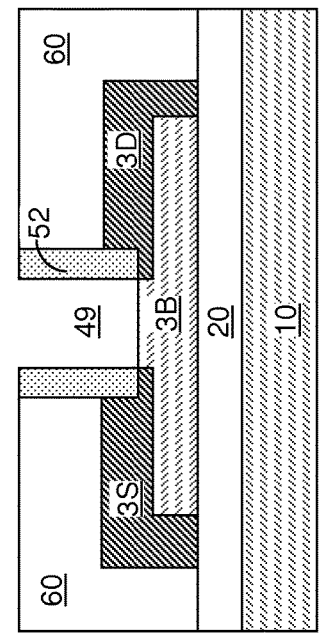

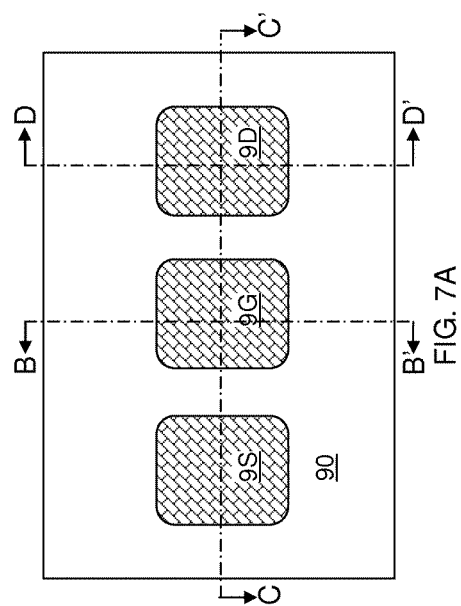
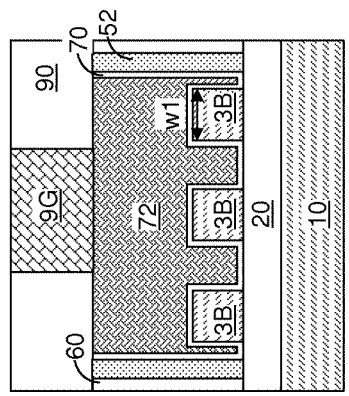
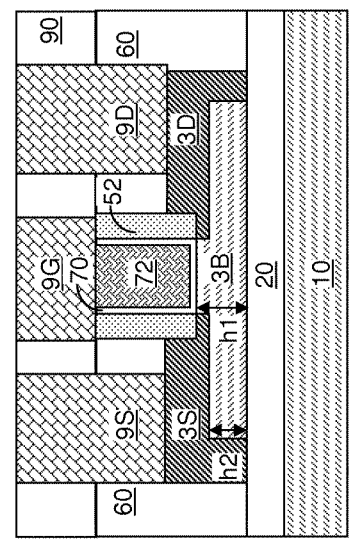
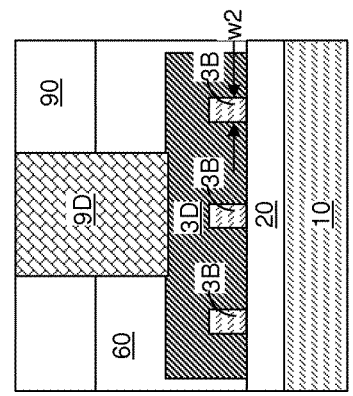
FIG. 7A
FIG. 7B
FIG. 7C
FIG. 7D

FIELD EFFECT TRANSISTORS WITH SELF-ALIGNED EXTENSION PORTIONS OF EPITAXIAL ACTIVE REGIONS

BACKGROUND

The present disclosure relates to a semiconductor structure, and particularly to field effect transistors including self-aligned epitaxial active region extensions and a method of manufacturing the same.

The gate length of a field effect transistor is determined by the distance between a pair of active region extensions. Typically, a combination of ion implantation and an activation anneal is employed to form active region extensions. The activation anneal is necessary because only electrical dopants located at substitutional sites are effective in providing free electrical charges in a band gap structure. However, the activation anneal also promotes diffusion of the implanted electrical dopants, thereby blurring the p-n junctions between the body region and the active region extensions. As a result, the diffusion of the implanted electrical dopants during the activation anneal has a deleterious effect of increased leakage current and variations in the threshold voltage. Thus, a field effect transistor is desired in which clearly defined p-n junctions are provided between a body region and active region extensions.

SUMMARY

A gate structure is formed across a single crystalline semiconductor fin. An amorphizing ion implantation is performed employing the gate structure as an implantation mask to amorphize surface portions of the semiconductor fin into inverted U-shaped amorphous semiconductor portions. A gate spacer is formed around the gate structure, and the inverted U-shaped amorphous semiconductor portions are etched selective to a single crystalline portion of the semiconductor fin and the gate structure. A pair of inverted U-shaped cavities is formed underneath the gate spacer and above the remaining portion of the semiconductor fin. A doped epitaxial semiconductor material is deposited by a selective epitaxy process to form doped epitaxial active regions that include self-aligned extension portions underlying the gate spacer.

According to an aspect of the present disclosure, a method of forming a semiconductor structure is provided. A semiconductor fin including a single crystalline semiconductor material is formed on a substrate. A gate structure is formed across the semiconductor fin. Surface portions of the semiconductor fin are amorphized employing the gate structure as an implantation mask. A gate spacer is formed around the gate structure and on the amorphous surface portions of the semiconductor fin. The amorphous surface portions of the semiconductor fin are removed while preserving a single crystalline portion of the semiconductor fin.

According to another aspect of the present disclosure, a semiconductor structure includes a semiconductor fin located on a substrate and including a first portion having a first height throughout and a pair of second portions. Each of the pair of second portions has a second height throughout and is adjoined to the first portion. The semiconductor structure further includes a gate structure, which includes a gate dielectric and a gate electrode and contacts a top surface and sidewall surfaces of the first portion. The semiconductor structure further includes a gate spacer and an active region. The gate spacer laterally surrounds the gate structure. A bottom surface of the gate spacer is planar with a horizontal interface betweens the gate structure and the first portion. The active region includes a doped epitaxial semiconductor material and contacts a top surface of one of the second portions, the bottom surface of the gate spacer, and an outer sidewall of the gate spacer.

BRIEF DESCRIPTION OF SEVERAL VIEWS OF THE DRAWINGS

FIG. 2A is a top-down view of an exemplary structure after formation of a disposable gate structure and amorphization of surface portions of semiconductor fins by ion implantation according to an embodiment of the present disclosure.

FIG. 2B is a vertical cross-sectional view of the exemplary structure along the vertical plane B-B' of FIG. 2A.

FIG. 2C is a vertical cross-sectional view of the exemplary structure along the vertical plane C-C' of FIG. 2A.

FIG. 2D is a vertical cross-sectional view of the exemplary structure along the vertical plane D-D' of FIG. 2A.

FIG. 3A is a top-down view of an exemplary structure after formation of a gate spacer according to an embodiment of the present disclosure.

FIG. 3B is a vertical cross-sectional view of the exemplary structure along the vertical plane B-B' of FIG. 3A.

FIG. 3C is a vertical cross-sectional view of the exemplary structure along the vertical plane C-C' of FIG. 3A.

FIG. 3D is a vertical cross-sectional view of the exemplary structure along the vertical plane D-D' of FIG. 3A.

FIG. 6A is a top-down view of an exemplary structure after removal of the disposable gate structure according to an embodiment of the present disclosure.

FIG. 6B is a vertical cross-sectional view of the exemplary structure along the vertical plane B-B' of FIG. 6A.

FIG. 6C is a vertical cross-sectional view of the exemplary structure along the vertical plane C-C' of FIG. 6A.

FIG. 6D is a vertical cross-sectional view of the exemplary structure along the vertical plane D-D' of FIG. 6A.

FIG. 7A is a top-down view of an exemplary structure after formation of a replacement gate structure according to an embodiment of the present disclosure.

FIG. 7B is a vertical cross-sectional view of the exemplary structure along the vertical plane B-B' of FIG. 7A.

FIG. 7C is a vertical cross-sectional view of the exemplary structure along the vertical plane C-C' of FIG. 7A.

FIG. 7D is a vertical cross-sectional view of the exemplary structure along the vertical plane D-D' of FIG. 7A.

DETAILED DESCRIPTION

Figure 1A:
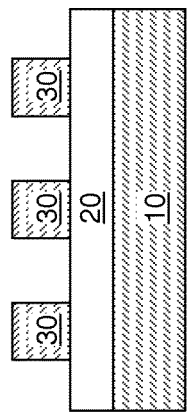
FIG. 1A is a top-down view of an exemplary structure after formation of semiconductor fins on a substrate according to an embodiment of the present disclosure.
Figure 1B:
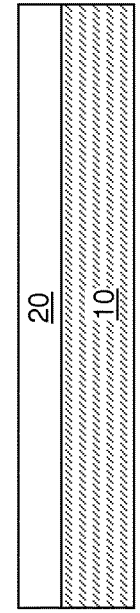
FIG. 1B is a vertical cross-sectional view of the exemplary structure along the vertical plane B-B' of FIG. 1A.
Figure 1C:
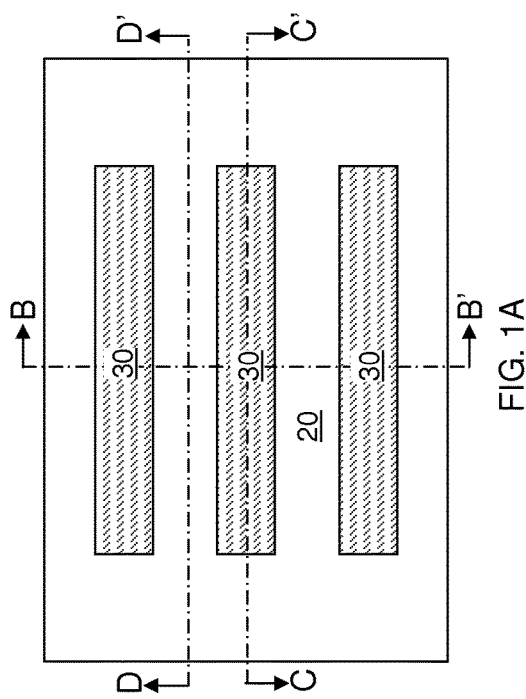
FIG. 1C is a vertical cross-sectional view of the exemplary structure along the vertical plane C-C' of FIG. 1A.
Figure 1D:
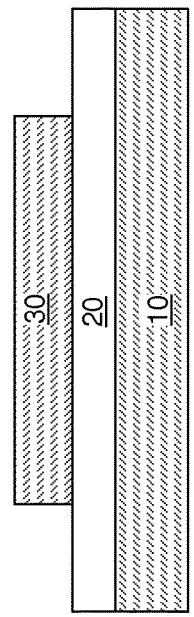
FIG. 1D is a vertical cross-sectional view of the exemplary structure along the vertical plane D-D' of FIG. 1A.

As stated above, the present disclosure relates to field effect transistors including self-aligned epitaxial active region extensions and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A-1D, an exemplary structure according to an embodiment of the present disclosure includes semiconductor fins 30 formed on a substrate (10, 20). In one embodiment, a semiconductor-on-insulator (SOI) substrate including a handle substrate 10, a buried insulator layer 20, and a top semiconductor layer can be provided. The top semiconductor layer of the SOI substrate can be patterned to form the semiconductor fins 30. The patterning of the top semiconductor layer can be performed, for example, by applying a photoresist layer over the top surface of the top semiconductor layer, lithographically patterning the top semiconductor layer, and anisotropically etching physically exposed portions of the top semiconductor layer employing the patterned photoresist layer as an etch mask. The anisotropic etch can be, for example, a reactive ion etch. The photoresist layer can be subsequently removed, for example, by ashing.

The handle substrate 10 can include a semiconductor material, a conductive material, and/or a dielectric material. The handle substrate 10 can provide mechanical support to the buried insulator layer 20 and the top semiconductor layer, and the semiconductor fins 30 that are remaining portions of the top semiconductor layer after the anisotropic etch. The thickness of the handle substrate 10 can be from 30 microns to 2 mm, although lesser and greater thicknesses can also be employed.

The buried insulator layer 20 includes an amorphous dielectric material. The buried insulator layer 20 can include a dielectric material such as silicon oxide, silicon nitride, silicon oxynitride, sapphire, or a combination thereof. The thickness of the buried insulator layer 20 can be from 50 nm to 5 microns, although lesser and greater thicknesses can also be employed. In one embodiment, the buried insulator layer 20 and the handle substrate 10 can be a single contiguous structure including a same insulator material, i.e., the handle substrate 10 and the buried insulator layer 20 can be merged into a single insulating layer including a same insulating material. In another embodiment, the substrate can be a bulk semiconductor substrate in which a buried insulator layer 20 is not present.

The top semiconductor layer, and consequently, the semiconductor fins 30 can include a single crystalline semiconductor material or a polycrystalline material. In one embodiment, the semiconductor fins 30 can include an elemental semiconductor material such as Si or Ge, a semiconductor material primarily composed of Group IV elements such as a silicon-germanium alloy or a silicon-carbon alloy, a III-V compound semiconductor material, a II-VI compound semiconductor material, or an organic semiconductor material. In one embodiment, the semiconductor fins 30 can include a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In one embodiment, the semiconductor fins 30 can consist essentially of undoped single crystalline silicon or single crystalline silicon doped with p-type dopant atoms or n-type dopant atoms.

As used herein, a "semiconductor fin" refers to a semiconductor structure including a portion having a shape of a rectangular parallelepiped. In one embodiment, the portion having the shape of a rectangular parallelepiped can be the entirety of the semiconductor structure. In another embodiment, the portion having the shape of a rectangular parallelepiped can be included in, and is less than, the entirety of the semiconductor structure. In one embodiment, the surfaces of a semiconductor can include three mutually perpendicular pairs of parallel sidewalls. The direction along which a semiconductor fin laterally extends the most is herein referred to as a "lengthwise direction" of the semiconductor fin. The height of the semiconductor fins 30 can be in a range from 5 nm to 300 nm, although lesser and greater heights can also be employed. The width of each semiconductor fin 30 can be in a range from 5 nm to 100 nm, although lesser and greater widths can also be employed. Multiple semiconductor fins 30 may be arranged such that the multiple semiconductor fins 30 have the same lengthwise direction, and are laterally spaced from each other along a horizontal direction that is perpendicular to the lengthwise direction. In this case, the horizontal direction that is perpendicular to the common lengthwise direction is referred to as a "widthwise direction."

Referring to FIGS. 2A-2D, a gate structure can be formed across at least one semiconductor fin 30. In one embodiment, the gate structure can be a disposable gate structure (50, 51). The disposable gate structure (50, 51) is a gate structure that is removed in a subsequent processing step. The disposable gate structure (50, 51) can be formed, for example, by deposition of a disposable material layer and optionally a gate cap dielectric layer, and patterning of the stack of the disposable material layer and the gate cap dielectric layer. A remaining portion of the disposable material layer constitutes a disposable material portion 50. A remaining portion of the gate cap dielectric layer, if employed, constitutes a gate cap dielectric portion 51.

The disposable material portion 50 can include a semiconductor material, a dielectric material, or a metallic material, provided that the material of the disposable material portion 50 can be removed selective to the materials of a planarization dielectric layer and a gate spacer to be subsequently formed and selective to the material of the semiconductor fins 30. For example, the disposable material portion 50 can include amorphous carbon, diamond-like carbon (DLC), polycrystalline or amorphous germanium, a silicon-germanium alloy, organosilicate glass, a doped silicate glass, an elemental metal, an alloy of at least two elemental metals, a conductive metallic alloy, or a combination thereof. The disposable gate structure (50, 51) can straddle the semiconductor fins 30 along the widthwise direction of the semiconductor fins 30.

Ions can be implanted into surfaces portions of the semiconductor fins 30 employing the disposable gate structure (50, 51) as an implantation mask. The ions can be ions of an elemental semiconductor material, ions of a noble gas, or ions of a gas including at least one fluorine atom, at least one chlorine atom, at least one oxygen atom, at least one nitrogen atom, at least one phosphor atom, at least one arsenic atom, at least one sulfur atom, and/or at least one boron atom. In one embodiment, the species of the ions can be selected so that the mass of the ions is greater than the average mass of the atoms of the semiconductor material in the semiconductor fins 30. For example, if the semiconductor fins 30 include a silicon germanium alloy, the implanted ions can be germanium ions. Exemplary species for the ions to be implanted into the surface portions of the semiconductor fins 30 include, but are not limited to, Ge, Si, Kr, Xe, Ne, $F_2$, $Cl_2$, $O_2$, $O_3$, $N_2$, $N_2O$, $NO_2$, $PH_3$, $AsH_3$, $SF_6$, and $BF_2$. In one embodiment, the species of the implanted ions can be germanium.

The energy of the implanted ions is selected such that the semiconductor material of the semiconductor fins 30 becomes amorphized. Further, the species and the energy of the implanted ions are selected such that the amorphized portions of the semiconductor fins 30 are limited to surface portions. Two amorphous surface portions 31, separated by the disposable gate structure (50, 51), are formed within each semiconductor fin 30. Each amorphous surface portion 31 is an amorphized semiconductor portion located underneath surfaces of a semiconductor fin 30, and includes the semiconductor material of the semiconductor fins 30 as provided at the processing steps of FIGS. 1A-1D, and further includes the implanted ions.

In one embodiment, the ion implantation is performed at a non-zero and non-orthogonal angle with respect to a vertical plane passing through the lengthwise direction of the semiconductor fins 30. The magnitude of the angle α between the vertical plane and the direction of the ion implantation can be in a range from $0.1 \times \pi/2$ to $0.9 \times \pi/2$ in radians, although lesser and greater angles can also be employed. In order to convert all surface portions underlying physically exposed surfaces, more than two rounds of ion implantation can be performed at different values of the angle cc. For example, a first value for the angle α during a first angled ion implantation can be in a range from $0.1 \times \pi/2$ to $0.19 \times \pi/2$ in radians, and a second value of the angle α during the second angled ion implantation can be in a range from $-0.9 \times \pi/2$ to $-0.1 \times \pi/2$ in radians. In one embodiment, the angled implantation angle α during the ion implantation steps can be set to +/−45 degrees.

Within each semiconductor fin 30, two sub-portions of each semiconductor fin 30, which are spaced from the sidewalls and the top surface of the semiconductor fin 30 and do not underlie the disposable gate structure (50, 51), remain single crystalline after the ion implantation process. Within each semiconductor fin 30, a single contiguous portion including the two sub-portions and the portion that underlies the disposable gate structure (50, 51) remain single crystalline after the ion implantation process. Within each semiconductor fin 30, the single contiguous portion including the same single crystalline semiconductor material as the semiconductor fins 30 as provided at the processing steps of FIGS. 1A-1D is herein referred to as a single crystalline semiconductor portion 30'. Each semiconductor fin 30 includes a single crystalline semiconductor portion 30' and two amorphous surface portions 31. The width of each vertical portion of an amorphous surface portion 31 can be in a range from 5% to 45% of the width of a semiconductor fin (30', 31) in which the amorphous surface portion 31 is formed.

Referring to FIGS. 3A-3D, a gate spacer 52 can be formed around the disposable gate structure (50, 51) and on the surfaces of the amorphous surface portions 31 of the semiconductor fins (30', 31). The gate spacer 52 includes a dielectric material, which can be, for example, silicon nitride, silicon oxide, silicon oxynitride, a dielectric metal oxide, a dielectric metal nitride, or a combination thereof. The inner gate spacer 52 can be formed, for example, by depositing a conformal dielectric material layer, and by anisotropically etching the conformal dielectric material layer. Horizontal portions of the conformal dielectric material layer are removed by the anisotropic etch, and remaining vertical portions of the conformal dielectric material layer constitute the gate spacer 52. The thickness of the gate spacer 52, i.e., the lateral dimension between an inner sidewall of the gate spacer 52 and a most proximal portion of the outer sidewall of the gate spacer 52, can be in a range from 5 nm to 100 nm, although lesser and greater thicknesses can also be employed.

Referring to FIGS. 4A-4D, the amorphous surface portions 31 of the semiconductor fins (30', 31) are removed selective to the single crystalline semiconductor portions 30' by an isotropic etch. An etch chemistry that provides a greater etch rate for the amorphous semiconductor material in the amorphous surface portions 31 than for the single crystalline semiconductor material in the single crystalline semiconductor portions 30' can be employed. The removal of the amorphous surface portions 31 of the semiconductor fins (30', 31) is thus performed while preserving a single crystalline portion of the semiconductor fins (30', 31), i.e., while preserving the entirety, or most, of the single crystalline semiconductor portions 30'.

In one embodiment, the etch selectivity, i.e., the ratio of the etch rate for the single crystalline semiconductor material in the single crystalline semiconductor portions 30' can be greater than the etch rate for the amorphous semiconductor material in the amorphous surface portions 31, can be greater than 2. Thus, the amorphous surface portions 31 of the semiconductor fins (30', 31) are removed by the isotropic etch that etches an amorphized semiconductor material in the amorphous surface portions 31 faster than the single crystalline semiconductor material in the single crystalline semiconductor portions 30' by a factor of at least two. In another embodiment, the etch selectivity can be greater than 3. In yet another embodiment, the etch selectivity can be greater than 10. In still another embodiment, the etch selectivity can be greater than 30. In one embodiment, the removal of the amorphous semiconductor material in the amorphous surface portions 31 can be performed selective to the single crystalline semiconductor material in the single crystalline semiconductor portions 30', i.e., without any substantial removal of the single crystalline semiconductor material in the single crystalline semiconductor portions 30' and while keeping the single crystalline semiconductor portions 30' essentially intact.

Figure 4A:
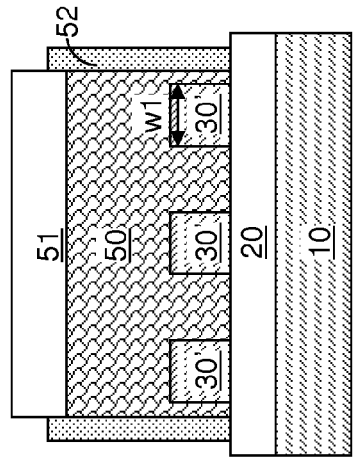
FIG. 4A is a top-down view of an exemplary structure after removal of amorphized portions of the semiconductor fins by an isotropic etch according to an embodiment of the present disclosure.
Figure 4C:
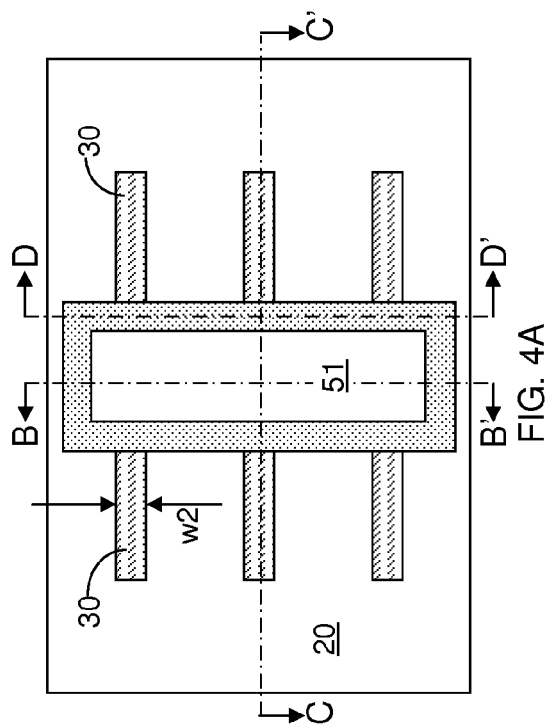
FIG. 4C is a vertical cross-sectional view of the exemplary structure along the vertical plane C-C' of FIG. 4A.
Figure 4B:
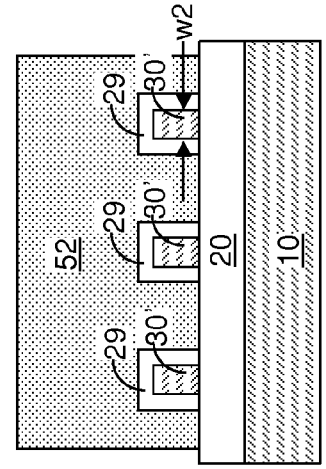
FIG. 4B is a vertical cross-sectional view of the exemplary structure along the vertical plane B-B' of FIG. 4A.
Figure 4D:
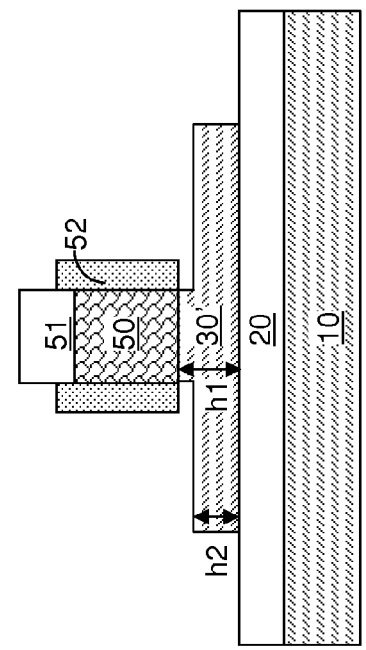
FIG. 4D is a vertical cross-sectional view of the exemplary structure along the vertical plane D-D' of FIG. 4A.

An undercut region 29 is formed underneath the gate spacer 52 and above each single crystalline semiconductor portions 30', which is a single crystalline portion of the semiconductor fin 30 in the processing steps of FIGS. 3A-3D, by removal of the amorphous surface portions 31 of the semiconductor fin (30', 31). Each undercut region 29 has a vertical cross-sectional shape of an inverted U-shape as illustrated in FIG. 4D. The inverted U-shape is invariant under translation between a vertical plane including an inner sidewall of the gate spacer 52 and perpendicular to the lengthwise direction of the single crystalline semiconductor portions 30' and another vertical plane including an outer sidewall of the gate spacer 52 and perpendicular to the lengthwise direction of the single crystalline semiconductor portions 30'. The lengthwise direction of the single crystalline semiconductor portions 30' is the same as the lengthwise direction of the semiconductor fins 30 as provided at the processing steps of FIGS. 1A-1D.

Each single crystalline semiconductor portions 30', which is a single crystalline portion of a semiconductor fin (30', 31) as provided at the processing steps of FIGS. 3A-3D, includes a first portion having a first height h1 throughout and underlying the disposable gate structure (50, 51), and a pair of second portions. Each of the pair of second portions has a second height h2 throughout, and is adjoined to the first portion. Each periphery at which the pair of second portions adjoin the first portion is within the a vertical plane including an interface between the disposable gate structure (50, 51) and the gate spacer 52 and perpendicular to the lengthwise direction of the single crystalline semiconductor portions 30'.

The first portion can have a first width w1, which is the same as the original width of a semiconductor fin 30 from which the first portion is derived. Each second portion can have a second width w2, which is less than the first width w1 by twice the thickness of a vertical portion of an amorphous surface portion 31. Each single crystalline semiconductor portion 30' includes three portions, each of the three portions having a shape of a rectangular parallelepiped.

Referring to FIGS. 5A-5E, active regions (3S, 3D) can be formed on physically exposed semiconductor surfaces of the single crystalline semiconductor portions 30' by selective deposition of a semiconductor material. As used herein, an "active region" can be a source region or a drain region. The active regions (3S, 3D) include a source region 3S that is formed on surfaces of the single crystalline semiconductor portions 30' located on one side of the disposable gate structure (50, 51), and a drain region 3D that is formed on surfaces of the single crystalline semiconductor portions 30' located on the other side of the disposable gate structure (50, 51).

In one embodiment, the selective deposition of the semiconductor material can be performed by a selective epitaxy process. During the selective epitaxy process, the deposited semiconductor material grows from physically exposed semiconductor surfaces, i.e., the physically exposed surfaces of the single crystalline semiconductor portions 30'. The semiconductor material does not grow from dielectric surfaces such as the surfaces of the gate cap dielectric portion 51, the gate spacer 52, or the buried insulator layer 20.

The active regions (3S, 3D) can be epitaxially aligned to the single crystalline semiconductor portions 30'. The active regions (3S, 3D) can include the same semiconductor material as, or a semiconductor material different from, the semiconductor material of the single crystalline semiconductor portions 30'. The growth of the active regions (3S, 3D) can proceed with, or without, crystallographically faceted surfaces depending on the deposited semiconductor material and the deposition conditions.

In one embodiment, the selective epitaxy process can proceed until multiple semiconductor material portions grown from neighboring single crystalline semiconductor portions 30' merge to form merged active regions (3S, 3D) such that the source region 3S is a single contiguous structure, and the drain region 3D is another single contiguous structure.

In one embodiment, the active regions (3S, 3D) can be formed with in-situ doping during the selective epitaxy process. Thus, each portion of the active regions (3S, 3D) can be formed as doped semiconductor material portions. Alternatively, the active regions (3S, 3D) can be formed by ex-situ doping. In this case, the active regions (3S, 3D) can be formed as intrinsic semiconductor material portions and electrical dopants can be subsequently introduced into the active regions (3S, 3D) to convert the active regions (3S, 3D) into doped semiconductor material portions. The active regions (3S, 3D) can have a doping of the opposite conductivity type than the single crystalline semiconductor portions 30'. In this case, a p-n junction can be formed at the interface between the single crystalline semiconductor portions 30' and each of the active regions (3S, 3D).

Each single crystalline semiconductor portion 30' is a semiconductor fin including three portions, each having a shape of a parallelepiped. The lengthwise direction of the single crystalline semiconductor portions 30' can be the same, and can be the same as the lengthwise direction of the semiconductor fins 30 as provided at the processing steps of FIGS. 3A-3D. Thus, each active region (3S, 3D) is formed directly on, and grows from, surfaces of the single crystalline portions of semiconductor fins. Further, each active region (3S, 3D) can contacts a horizontal bottom surface of the gate spacer 52 and a pair of vertical sidewalls of the gate spacer 52 that are parallel to the lengthwise direction of the semiconductor fins.

Each single crystalline semiconductor portion 30' functions as a body region of the field effect transistor in the exemplary structure, and is herein referred to as a body region 3B. An extension portion, i.e., a laterally protruding portion, of the source region 3S fills each undercut on the source side and underneath the gate spacer 52, and an extension portion of the drain region 3D fills each undercut on the drain side and underneath the gate spacer 52. The bottommost surface of the gate spacer 52 can be vertically spaced from a top surface of each body region 3B by a separation distance d, which is the same as the height of a horizontal sub-portion of the extension portion of the source region 3S or a horizontal sub-portion of the extension portion of the drain region 3D.

Figure 5A:
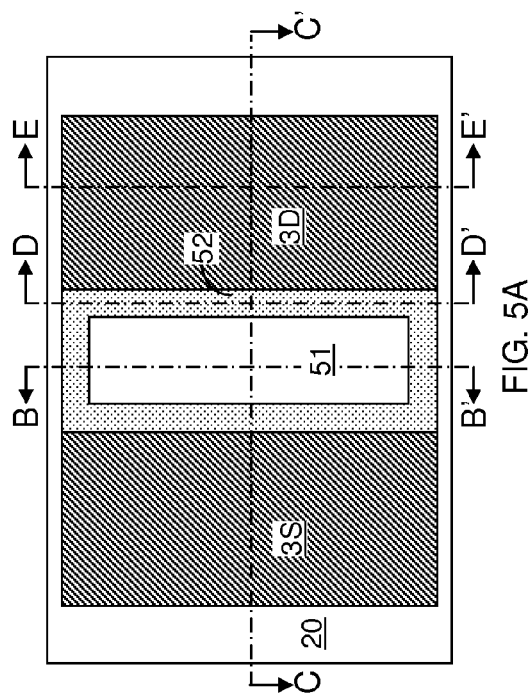
FIG. 5A is a top-down view of an exemplary structure after formation of active regions according to an embodiment of the present disclosure.
Figure 5B:
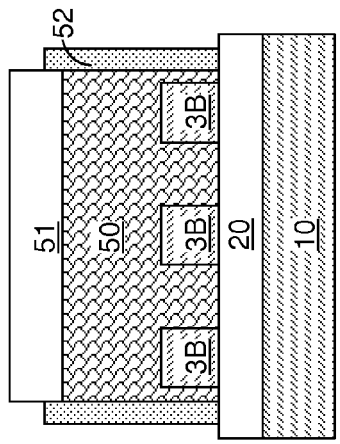
FIG. 5B is a vertical cross-sectional view of the exemplary structure along the vertical plane B-B' of FIG. 5A.
Figure 5C:
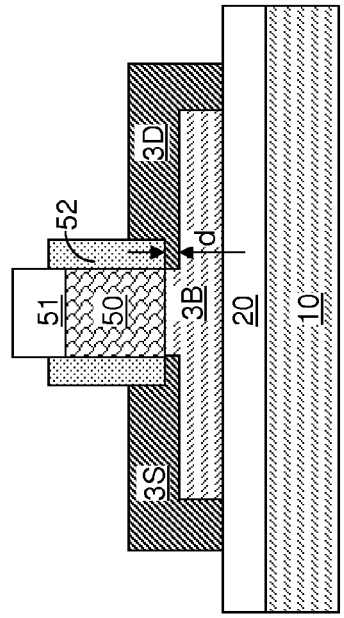
FIG. 5C is a vertical cross-sectional view of the exemplary structure along the vertical plane C-C' of FIG. 5A.
Figure 5D:
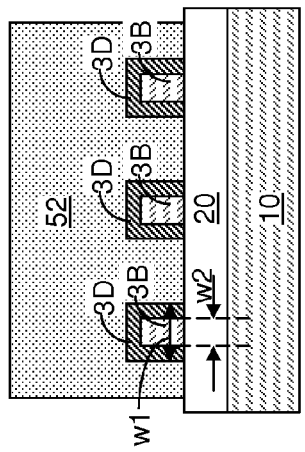
FIG. 5D is a vertical cross-sectional view of the exemplary structure along the vertical plane D-D' of FIG. 5A.
Figure 5E:
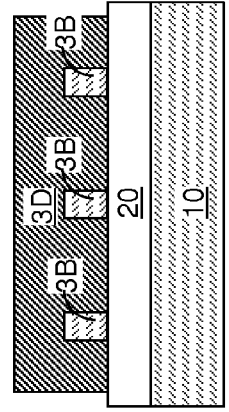
FIG. 5E is a vertical cross-sectional view of the exemplary structure along the vertical plane E-E' of FIG. 5A.

Each extension portion of the source region 3S can have an inverted U-shape, and each extension portion of the drain region 3D can have an inverted U-shape, as illustrated in FIG. 5D. The lateral dimension of each extension portion of the source region 3S along the lengthwise direction of the body regions 3B can be the same as the thickness of the gate spacer 52. Likewise, the lateral dimension of each extension portion of the drain region 3D along the lengthwise direction of the body regions 3B can be the same as the thickness of the gate spacer 52. Outer sidewalls of the extension portions of the source region 3S and outer sidewalls of the extension portions of the drain region 3D can be within the same vertical planes as the sidewalls of the first portion of each body region 3B, i.e., the portion that underlies the disposable gate structure (50, 51) and having the first width w1.

Referring to FIGS. 6A-6D, a planarization dielectric layer 60 can be formed over the active regions (3S, 3D), the disposable gate structure (50, 51), the gate spacer 52, and the buried insulator layer 20. The dielectric material of the planarization dielectric layer 60 can be deposited, for example, by chemical vapor deposition (CVD) or spin coating. The planarization dielectric layer 60 includes a dielectric material such as silicon oxide, silicon nitride, silicon oxynitride, organosilicate glass (OSG), or a combination thereof. Chemical mechanical planarization (CMP) can be employed to planarized the top surface of the planarization dielectric layer 60. In one embodiment, the gate cap dielectric portion 51 can be employed as a stopping structure during the planarization process.

The disposable gate structure (50, 51) is subsequently removed selective to the planarization dielectric layer 60, the gate spacer 52, and the body regions 3B (which is the single crystalline portion of the semiconductor fins 30 as provided at the processing steps of FIGS. 3A-3D). At least one isotropic etch and/or at least one anisotropic etch may be employed to removed the disposable gate structure (50, 51). The gate cap dielectric portion 51 can be removed by a wet etch or a dry etch. Alternately, the gate cap dielectric portion 51 can be removed during the planarization of the top surface of the planarization dielectric layer 60. If the disposable material portion 50 includes amorphous carbon or diamond-like carbon (DLC), the disposable material portion 50 can be removed by ashing. Depending on the composition of the disposable material portion 50, a suitable etch chemistry can be selected in order to remove the disposable material portion 50 while minimizing collateral etching of the body regions 3B. A gate cavity 79 is formed in the volume from which the disposable gate structure (50, 51) is removed. The etch processes that remove the disposable gate structure (50, 51) may, or may not, be selective to the dielectric material of the buried insulator layer 20.

Referring to FIGS. 7A-7D, a replacement gate structure (70, 72) can be formed in the gate cavity 49 by deposition of a gate dielectric layer and at least one conductive material layer. The gate dielectric layer can include any gate dielectric material known in the art. The at least one conductive material layer can include any conductive material that is known to be suitable for a gate electrode of a field effect transistor. Excess portion of the at least one conductive material layer and the gate dielectric layer can be removed from above the top surface of the planarization dielectric layer 60, for example, by chemical mechanical planarization (CMP). The remaining portion of the gate dielectric layer constitutes a gate dielectric 70 of the replacement gate structure (70, 72), and the remaining portion of the at least one conductive material layer constitutes a gate electrode 72 of the replacement gate structure (70, 72).

The gate dielectric 70 is formed directly on the top surface and the sidewalls of each body region 3B. In one embodiment, the gate dielectric 70 can be a single contiguous structure that contacts all top surfaces and sidewall surfaces of the body regions 3B and the inner sidewalls of the gate spacer 52 and the top surface of the buried insulator layer 20.

A contact level dielectric layer 90 can be formed over the planarization dielectric layer 60. The contact level dielectric layer 90 includes a dielectric material such as organosilicate glass (OSG), silicon oxide, silicon nitride, or a combination thereof. The contact level dielectric layer 90 can be formed, for example, by chemical vapor deposition (CVD) or spin coating. Various contact via structures (9S, 9D, 9G) can be formed through the contact level dielectric layer 90 and the planarization dielectric layer 60. The contact via structures (9S, 9D, 9B) can include a source contact via structure 9S that contacts the source region 3S, a drain contact via structure 9D that contacts the drain region 3D, and a gate contact via structure 9G that contacts the gate electrode 72.

The exemplary semiconductor structure includes, among others, a semiconductor fin 3B located on a substrate and including a first portion having a first height $h1$ throughout and a pair of second portions. Each of the pair of second portions has a second height $h2$ throughout and is adjoined to the first portion. The exemplary semiconductor structure further includes a gate structure (70, 72), which contains a gate dielectric 70 and a gate electrode 72, and contacts a top surface and sidewall surfaces of the first portion. The exemplary semiconductor structure further includes a gate spacer 52 laterally surrounding the gate structure (70, 72). A bottom surface of the gate spacer 52 is planar with a horizontal interface between the gate structure (70, 72) and the first portion. The exemplary semiconductor structure further includes an active region (3S or 3D) including a doped epitaxial semiconductor material and contacting a top surface of one of the second portions, the bottom surface of the gate spacer 52, and an outer sidewall of the gate spacer 52.

In one embodiment, the active region (3S or 3D) can further contact a sidewall of the first portion. In one embodiment, a contact area between the active region (3S or 3D) and the sidewall of the first portion can include a horizontal portion having a height that is the same as a different between the first height $h1$ and the second height $h2$, and a pair of vertical portions having a uniform width, which can be the same as the difference between the first height $h1$ and the second height $h2$. This configuration can result when the angled implantation angle $\alpha$ during the ion implantation steps of FIGS. 2A-2D is set to +/−45 degrees.

In one embodiment, the sidewalls of the first portion that are perpendicular to the lengthwise direction of the semiconductor fin 3B can be vertically coincident with an inner sidewall of the gate spacer 52. In one embodiment, the first portion can have the first width $w1$ throughout, and each of the pair of second portions can have the second width $w2$ throughout. The second width $w2$ can be less than the first width $w1$. In one embodiment, the difference between the first width $w1$ and the second width $w2$ can be twice the difference between the first height $h1$ and the second height $h2$. This configuration can result when the angled implantation angle $\alpha$ during the ion implantation steps of FIGS. 2A-2D is set to +/−45 degrees.

In one embodiment, the entire interface between the semiconductor fin and the active region constitutes a p-n junction. In one embodiment, the active region (3S or 3D) includes an extension portion having a vertical cross-sectional shape of an inverted U-shape that is invariant under translation between a vertical plane including an inner sidewall of the gate spacer 52 and another vertical plane including the outer sidewall of the gate spacer 52. The vertical planes are perpendicular to the lengthwise direction of the body region 3B. In one embodiment, a vertical interface between the active region (3S or 3D) and gate spacer 52 can be within a same vertical plane as a vertical interface between the gate structure (70, 72) and the first portion of the body region 3B.

The field effect transistor within the exemplary semiconductor structure includes at least one extension portion of the source region 3S and at least one extension portion of the drain region 3D that are self-aligned to the edges of the gate electrode 72. Each of the at least one extension portion of the source region 3S can have the same dopant concentration as the rest of the source region 3S, and each of the at least one extension portion of the drain region 3D can have the same dopant concentration as the rest of the drain region 3D. By eliminating any dopant gradient across the entirety of the source region 3S and across the entirety of the drain region 3D, external resistance of the field effect transistor can be limited only by the resistivity of the doped semiconductor material within the source region 3S and the drain region 3D, and is not limited by any dopant gradient near the extension portions of the source region 3S or the drain region 3D. Further, use of selective epitaxy process for formation of the source region 3S and the drain region 3D can minimize the junction gradient at the p-n junctions, and provide a sharp transition in the dopant concentration across each p-n junction. The enhancement of the junction gradient (in terms of the dopant concentration change) can provide well-defined transistor characteristics such as the threshold voltage.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a semiconductor fin comprising a single crystalline semiconductor material on a substrate;
    forming a gate structure across said semiconductor fin;
    amorphizing surface portions of said semiconductor fin located on each side of the gate structure employing said gate structure as an implantation mask to create amorphous surface portions of said semiconductor fin, wherein each amorphous surface portion has an inverted U-shape and surrounds sidewall surfaces and a topmost surface of a single crystalline sub-portion of said semiconductor fin that remains beneath said amorphous surface portions of said semiconductor fin;
    forming a gate spacer around said gate structure and on said amorphous surface portions of said semiconductor fin;
    removing said amorphous surface portions of said semiconductor fin to expose each single crystalline sub-portion of said semiconductor fin, wherein each single crystalline sub-portion of said semiconductor fin directly contacts a single crystalline portion of said semiconductor fin beneath said gate structure and has outermost sidewalls that are bare, and wherein said single crystalline portion of said semiconductor fin beneath said gate structure has a first height throughout, and each single crystalline sub-portion of said semiconductor fin has a second height throughout, wherein said second height is less than said first height;
    wherein an undercut region is formed underneath said gate spacer and above each single crystalline sub-portion of said semiconductor fin by removal of said amorphous surface portions of said semiconductor fin; and
    forming an active region directly on said outermost sidewalls of said each single crystalline sub-portion of said semiconductor fin and directly on topmost surfaces of each single crystalline sub-portion of said semiconductor fin.

2. The method of claim 1, wherein said active region is grown by a selective epitaxy process from each single crystalline sub-portion of said semiconductor fin, and contacts a horizontal bottom surface of said gate spacer and a pair of vertical sidewalls of said gate spacer that are parallel to a lengthwise direction of said semiconductor fin.

3. The method of claim 1, further comprising forming a planarization dielectric layer over said active region.

4. The method of claim 3, wherein said gate structure is a disposable gate structure, and said method further comprises:
    forming a gate cavity by removing said gate structure selective to said single crystalline semiconductor material of said semiconductor fin, said gate spacer, and said planarization dielectric layer; and
    forming a replacement gate structure including a gate dielectric and a gate electrode in said gate cavity.

5. The method of claim 1, wherein said surface portions of said semiconductor fin are amorphized by implanting ions into said surface portions.

6. The method of claim 1, wherein said amorphous surface portions of said semiconductor fin are removed by an isotropic etch that etches an amorphized semiconductor material in said amorphous surface portions faster than said single crystalline semiconductor material by a factor of at least two.

7. The method of claim 1, wherein said undercut region has a vertical cross-sectional shape of an inverted U-shape.

8. The method of claim 1, wherein said amorphizing comprises implanting ions of an elemental semiconductor material.

9. The method of claim 1, wherein said amorphizing comprises implanting ions of a noble gas.

10. The method of claim 1, wherein said amorphizing comprises implanting ions having a mass greater than an average mass of said single crystalline semiconductor material that provides said semiconductor fins.

11. The method of claim 1, wherein an upper horizontal surface of each amorphous surface portion is located on a topmost surface of said single crystalline sub-portion of said semiconductor fin.

* * * * *